(12) United States Patent
Passlack et al.

(10) Patent No.: US 7,842,587 B2
(45) Date of Patent: Nov. 30, 2010

(54) III-V MOSFET FABRICATION AND DEVICE

(75) Inventors: Matthias Passlack, Chandler, AZ (US);
Jonathan K. Abrokwah, Chandler, AZ (US); Karthik Rajagopalan, Chandler, AZ (US); Haiping Zhou, Bearsden (GB); Richard J. Hill, Glasgow (GB); Xu Li, Kirkintilloch (GB); David A. Moran, Glasgow (GB); Iain G. Thayne, Milngavie (GB); Peter Zurcher, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 265 days.

(21) Appl. No.: 12/022,942

(22) Filed: Jan. 30, 2008

(65) Prior Publication Data

US 2009/0189252 A1 Jul. 30, 2009

(51) Int. Cl.
*H01L 21/20* (2006.01)

(52) U.S. Cl. .................. 438/483; 438/216; 438/590; 257/E21.398; 257/E29.089

(58) Field of Classification Search ............... 438/216, 438/483, 502, 509, 590, 591, 604, 767; 257/E21.398, 257/E29.089
See application file for complete search history.

(56) References Cited

U.S. PATENT DOCUMENTS 4,914,059 A * 4/1990 Nissim et al. ............... 438/590
7,119,381 B2 * 10/2006 Passlack ..................... 257/192
7,432,565 B2 * 10/2008 Passlack ..................... 257/403
7,435,636 B1 * 10/2008 Hanafi ........................ 438/183
2005/0170574 A1 * 8/2005 Sheppard et al. ............ 438/172
2010/0025729 A1 * 2/2010 Abrokwah et al. .......... 257/192

OTHER PUBLICATIONS

Rajagopalan, R. et al., 1-micron Enhancement Mode GaAs N-Channel MOSFETs with Transconductance Exceeding 250 mS/mm, IEEE Electron. Dev. Lett., vol. 28, No. 2, pp. 100-102, 2007.

* cited by examiner

*Primary Examiner*—Ha Tran T Nguyen
*Assistant Examiner*—Daniel Whalen
(74) *Attorney, Agent, or Firm*—Jackson Walker L.L.P.

(57) ABSTRACT

A semiconductor fabrication process includes forming a gate dielectric layer (120) overlying a substrate (101) that includes a III-V semiconductor compound. The gate dielectric layer is patterned to produce a gate dielectric structure (121) that has a substantially vertical sidewall (127), e.g., a slope of approximately 45° to 90°. A metal contact structure (130) is formed overlying the wafer substrate. The contact structure is laterally displaced from the gate dielectric structure sufficiently to define a gap (133) between the two. The wafer (100) is heat treated, which causes migration of at least one of the metal elements to form an alloy region (137) in the underlying wafer substrate. The alloy region underlies the contact structure and extends across all or a portion of the wafer substrate underlying the gap. An insulative or dielectric capping layer (140,150) is then formed overlying the wafer and covering the portion of the substrate exposed by the gap.

13 Claims, 4 Drawing Sheets

III-V MOSFET FABRICATION AND DEVICE

BACKGROUND

1. Field

The disclosed subject matter is in the field of semiconductor fabrication and, more specifically, fabrication of devices on III-V or compound semiconductor substrates.

2. Related Art

The use of compound semiconductor substrates, including GaAs and other III-V semiconductor substrates, as the basis for fabricating metal-oxide-semiconductor (MOS) field effect transistors (FETS) has been studied as a means of obtaining high performance, low power devices for nano-CMOS applications. Among the challenges presented by III-V processes is the fabrication of a gate dielectric having a suitably low defect density and a suitably high dielectric constant on a III-V substrate integrated within a process that includes the formation of stable and low resitivity source/drain contact structures.

BRIEF DESCRIPTION OF THE DRAWINGS

Disclosed embodiments are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
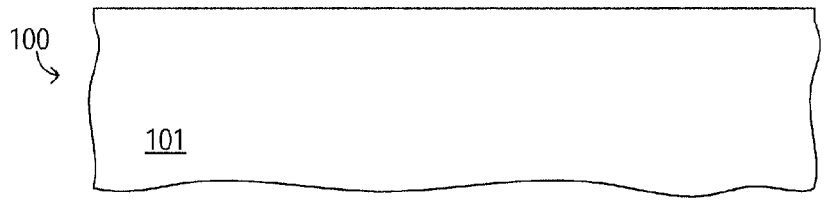
FIG. 1 is a partial cross-sectional representation of a wafer at a selected stage in an embodiment of a semiconductor fabrication process.

In one aspect, a disclosed embodiment of a semiconductor fabrication process includes forming a gate dielectric layer overlying a wafer substrate. The substrate includes at least one layer of a III-V semiconductor compound. The III-V semiconductor compound may be a binary compound such as GaAs or a ternary compound such as InGaAs and/or AlGaAs.

The disclosed embodiment of the process includes patterning the gate dielectric layer to produce a gate dielectric structure that has a substantially vertical sidewall, e.g., a sidewall that forms an angle with the underlying wafer in the range of approximately 45° to 90°. A contact structure is formed overlying the wafer substrate. The contact structure is laterally displaced from the gate dielectric structure sufficiently to define a gap between the two. The contact structure as disclosed includes at least one metal, e.g., Ni, Ge, and/or Au. The contact structure material may include one or more elements that have a work function greater than approximately 5 eV.

The wafer is then heat treated, e.g., in an RTA of approximately 440° C. for approximately 30 seconds. The heat treatment causes migration of at least one of the metal elements to form an alloy region in an upper portion of the underlying wafer substrate. The alloy region underlies the contact structure and extends laterally across a portion of the wafer substrate underlying the gap. An insulative or dielectric capping layer is then formed overlying the wafer and covering the portion of the substrate exposed by the gap.

Forming the gate dielectric layer may include forming the gate dielectric layer using molecular beam epitaxy (MBE). The gate dielectric layer may include an oxygen-based dielectric compound that includes an oxygen element and a second element where the second element is present in the III-V semiconductor compound. In embodiments that include a GaAs substrate layer, for example, the dielectric compound may include compounds such as $Ga_2O_3$. Patterning of the gate dielectric layer may include forming a polymethyl methylcrylate (PMMA) mask overlying a first portion of the gate dielectric layer and exposing a second portion of the gate dielectric layer. Thereafter the second portion of the gate dielectric layer is removed by immersing the wafer in a highly dilute HCl solution. The resulting gate dielectric structure includes substantially vertical sidewalls that form an angle in the range of approximately 45° to 90° with the underlying substrate.

Forming the capping layer may include forming a first capping layer of a first silicon-nitrogen compound and depositing a second capping layer of a second silicon-nitrogen compound overlying the first capping layer. Forming the first capping layer may include forming the first capping layer using a room temperature deposition process. Forming the second capping layer may include forming the second capping layer by chemical vapor deposition (CVD) at a temperature of approximately 200° C. or less.

An epitaxially formed layered structure may be formed over the wafer substrate prior to forming the gate dielectric layer. In these embodiments, the gate dielectric is formed over the epitaxial layered structure. An upper portion of the epitaxial layered structure may include additional III-V semiconductor compound layers.

Referring now to the drawings, selected stages in an embodiment of semiconductor fabrication process for manufacturing a field effect transistor (FET) on a semiconductor wafer 100 are shown. As depicted in FIG. 1, wafer 100 includes a monocrystalline semiconductor substrate 101. In some embodiments, semiconductor substrate 101 is a compound semiconductor, which may be referred to herein as a III-V semiconductor substrate to emphasize the compound as including a first element from column III of the periodic table and a second element from column V. In some embodiments, for example, semiconductor substrate 101 is a monocrystalline gallium arsenide (GaAs) substrate or includes a layer of GaAs or another III-V compound. The III-V compound may be binary semiconductor compound, a ternary III-V compound, or another suitable compound.

Figure 2:
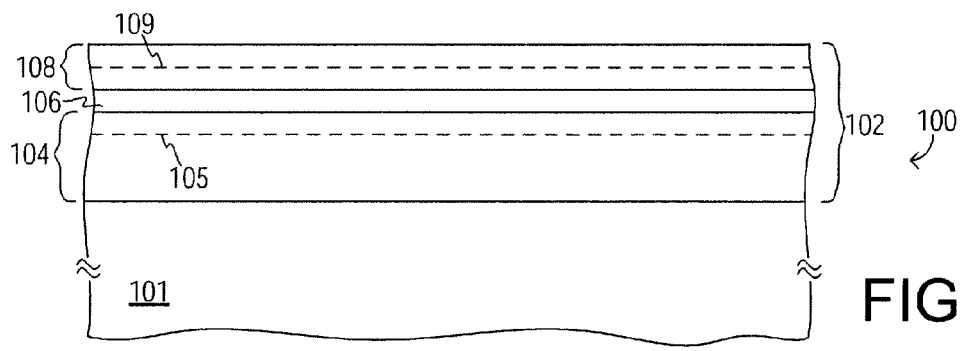
FIG. 2 depicts processing subsequent to FIG. 1 in which a layered structure is formed overlying the wafer substrate.

Referring now to FIG. 2 of the depicted embodiment, a layered structure 102 is formed overlying substrate 101. As depicted in FIG. 2, layered structure 102 includes a buffer layer 104 overlying substrate 101, a channel layer 106 overlying buffer layer 104, and a spacer layer 108 overlying channel layer 106. Embodiments of layered structure 102 may include one or more layers of binary or ternary III-V semiconductor compounds. In one embodiment, for example, buffer layer 104 is or includes a GaAs layer, channel layer 106 is or includes an InGaAs layer, and spacer layer 108 is or includes AlGaAs.

Layered structure 102 may be an epitaxial layered structure in which one or more of the layers within layered structure 102 are formed epitaxially. Epitaxially formed layers are desirable because they share the crystalline structure of the substrate or other layer upon which they are formed. Epitaxial formation processes suitable for use in fabricating at least some of the layers of layered structure 102 include molecular beam epitaxy (MBE), in which a source material is heated to produce an evaporated beam of source material particles in an ultra-high vacuum. The evaporated particles travel through the vacuum and condense on the substrate. Films grown by MBE are desirable for their atomic ordering and for the chemically clean surfaces that result. Other processes potentially suitable in the formation of at least some portion of layered structure 102 include metal organic chemical vapor deposition (MOCVD).

Wafer 100 as shown in FIG. 2 includes two additional layers, indicated by dashed lines, referred to herein as first doped layer 105 and second doped layer 109. During growth of layered structure 102, one or more such doped layers may be formed above, below, or within channel layer 106 using any of various doping techniques. In some embodiments, for example, first doped layer 105 and/or second doped layer 109 are formed by well known delta doping processes. One type of delta doping process achieves formation of doped layers by temporarily suspending the supply of one or more epitaxial species, e.g., Ga and/or As, and exposing the wafer only to a doping species e.g., Si.

Thus, for example, the formation of layered structure 102 in some embodiments includes forming a first portion of buffer layer 104, performing a delta doping process to form first doped layer 105, and thereafter resuming the formation of buffer layer 104. Similarly, the formation of spacer layer 108 may include forming a first portion of spacer layer 108, suspending formation of spacer layer 108 while a delta doping process is performed to form second delta-doped layer 109, and thereafter resuming and completing the formation of spacer layer 108. Although the depicted embodiment illustrates two delta-doped layers (105 and 109), other embodiments may employ fewer or more delta-doped layers and the delta-doped layers may positioned differently than delta-doped layers 105 and 109 are positioned as shown in FIG. 2.

The level of dopant used to form delta-doped layers 105 and 109 is an implementation detail. For example, for an n-channel EMOSFET (Enhancement mode Metal Oxide Semiconductor Field Effect Transistor) for which the targeted threshold voltage is approximately 0.3 V, the targeted gate dielectric thickness is approximately 10-20 nm, and the targeted sheet resistance is below 500 ohms/square, the targeted work function for a subsequently formed metal gate electrode is in the range of approximately 5.2 to 5.7 eV.

If iridium, which has a work function of approximately 5.3 eV, is used for the metal gate electrode, a delta-doping level of approximately $2.6 \times 10^{12}$ cm$^{-2}$ or less is generally acceptable. Accordingly, first and second delta-doped layers 105 and 109 in some embodiments, could be doped to a cumulative total of approximately $2.6 \times 10^{12}$ cm$^{-2}$ or less to achieve a threshold voltage ($V_T$) of approximately 0.3V, which is a suitable threshold voltage for an operable n-channel enhancement-mode MOSFET. In contrast, if platinum, which has a 5.7 eV work function, is used as the metal gate electrode, a delta-doping level of approximately $4.1 \times 10^{12}$ cm$^{-2}$ or less is acceptable, resulting in a very low sheet resistance of approximately 260 ohms/square and achieves a $V_T$ of 0.3 V in the platinum gate implementation.

Figure 3:
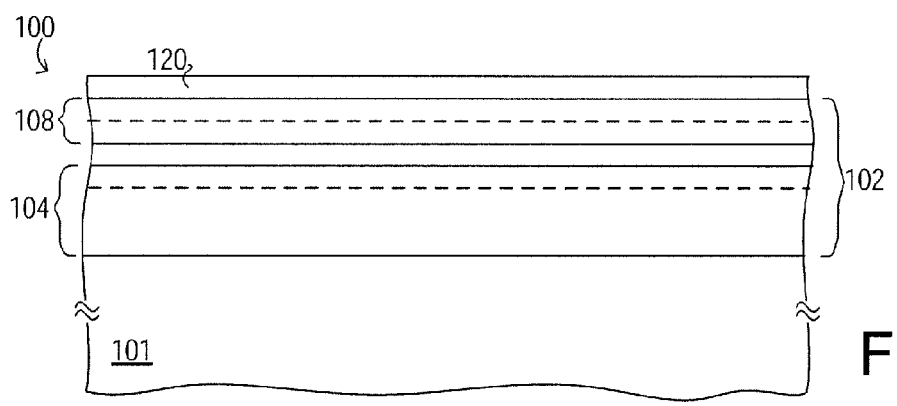
FIG. 3 depicts processing subsequent to FIG. 2 in which a gate dielectric layer is formed overlying the layered structure.

Referring now to FIG. 3, a gate dielectric layer 120 is formed overlying layered structure 102. Although gate dielectric layer 120 is depicted in FIG. 3 as a single layer, implementations of gate dielectric layer 120 may include two or more component layers. In some embodiments, formation of gate dielectric layer 120 or at least one component layer of gate dielectric layer 120 is achieved using MBE. In one embodiment, for example, formation of gate dielectric layer 120 includes deposition of a gallium oxide ($Ga_2O_3$) layer by MBE or MOCVD followed by MBE or MOCVD deposition of a GdGaO layer. In this embodiment, the $Ga_2O_3$ layer may be relatively thin, e.g., five or fewer monolayers, and the GdGaO layer is relatively thick, e.g., approximately 10 nm.

Figure 4:
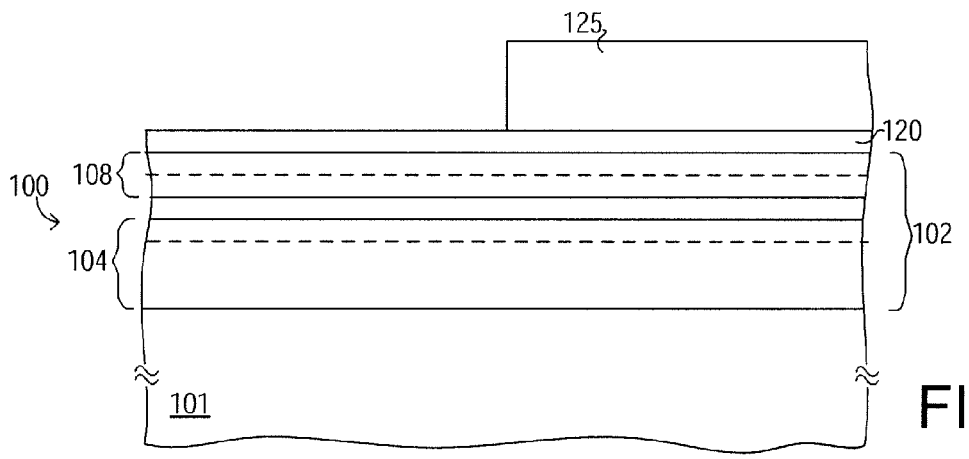
FIG. 4 depicts processing subsequent to FIG. 3 in which a resist mask is formed overlying the gate dielectric layer.
Figure 5:
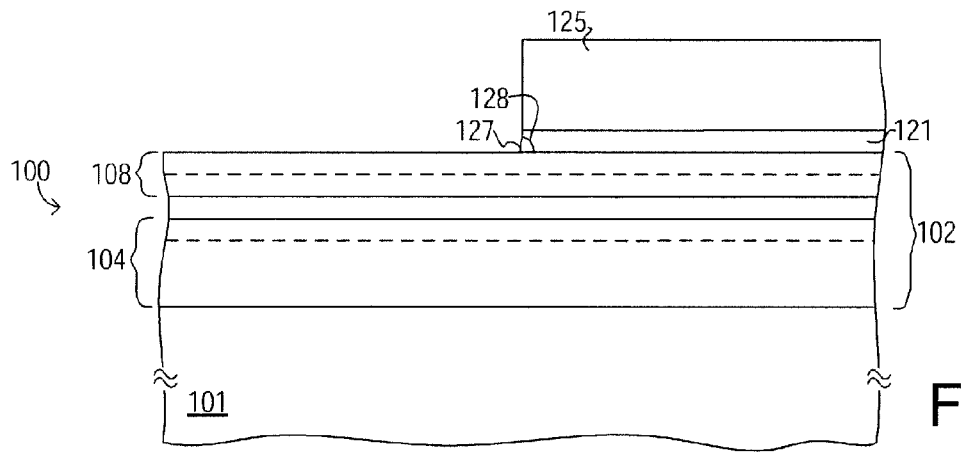
FIG. 5 depicts processing subsequent to FIG. 4 in which the gate dielectric layer is patterned to form a gate dielectric structure.

Turning now to FIG. 4 and FIG. 5, the patterning of gate dielectric layer 120 to form a gate dielectric structure 121, also referred to simply as gate dielectric 121, is depicted in two cross-sectional representations to emphasize an aspect of the disclosed process. The process for patterning gate dielectric layer 120 depicted produces a gate dielectric 121 characterized by an abrupt termination. For purposes of this discussion, the abrupt termination is reflected in a substantially vertical profile of a sidewall 127 (FIG. 5) of gate dielectric 121.

Conventional gate dielectric structures for III-V devices are generally characterized by non-abrupt or tapered sidewalls. These tapered sidewalls are generally considered to have a relatively high concentration of defects and a relatively high concentration of charges. The presence of such charges induces a depletion layer extending from the wafer upper surface into layered structure 102. This depletion layer is particularly problematic in connection with enhancement mode devices, which are inherently surface devices, i.e., devices whose operation is largely determined by activity occurring in very close proximity to the surface of the wafer.

Formation of gate dielectric 121 having a substantially vertical or abrupt sidewall 127 is achieved in one embodiment using a particular masking process in conjunction with a particular etch process. In some embodiments, for example, the formation of gate dielectric 121 and abrupt sidewall 127 includes forming a resist mask 125 overlying a portion of gate dielectric layer 120. Resist mask 125 is formed, according to one implementation by depositing, e.g., spin coating, a film of polymethyl methacrylate (PMMA) dissolved in a solvent over wafer 100. The thickness of the film may be in the range of approximately 100 to 2000 nm. The deposited resist film is then cured in a conventional manner to drive off the solvent.

Patterning resist mask 125 may include exposing portions of resist mask 125 to an electron beam (e-beam) produced by an electron beam lithography system, or another suitable energy source (e.g., deep UV light or X-ray). Portions of the film subjected to one or more of these energy sources may then be removed with a chemical developer. Thus, PMMA acts as a positive resist where resist mask 125 as shown in FIG. 4 comprises the portion of the originally deposited mask that was not exposed to the e-beam or other energy source.

Following the formation of resist mask 125, the exposed portions of gate dielectric layer 120, i.e., those portions of gate dielectric layer 120 not underlying resist mask 125, are etched away or otherwise removed. In one embodiment, the process used to etch exposed portions of gate dielectric layer 120 to form gate dielectric 121 includes a wet etch in which wafer 100 is immersed in a highly dilute solution of HCl. For purposes of this disclosure, a highly dilute HCl solution suitable for etching gate dielectric layer 120 has an HCl concentration of less than approximately 5% and still more preferably less than approximately 1%.

Gate dielectric 121 as shown in FIG. 5 has an abrupt termination that includes a sidewall 127 having a substantially vertical profile. The substantially vertical profile of sidewall 127 may be quantified as an angle or a displacement. Assuming a substantially straight sidewall profile, i.e., not curved, the verticality or abruptness of the profile may be characterized by the interior angle 128 formed between sidewall 127 and the underlying upper surface of layered structure 102. In some embodiments, this angle is preferably greater than approximately 45°. The abruptness of sidewall 127 may also be characterized by its horizontal displacement or span, i.e., the sidewall's span in the direction parallel to the upper surface of layered structure 102 as shown in the cross section of FIG. 5. For embodiments in which a thickness of gate dielectric 121 is approximately 10 nm, for example, a horizontal span of sidewall 127 is preferably less than approximately 10 nm.

Figure 6:
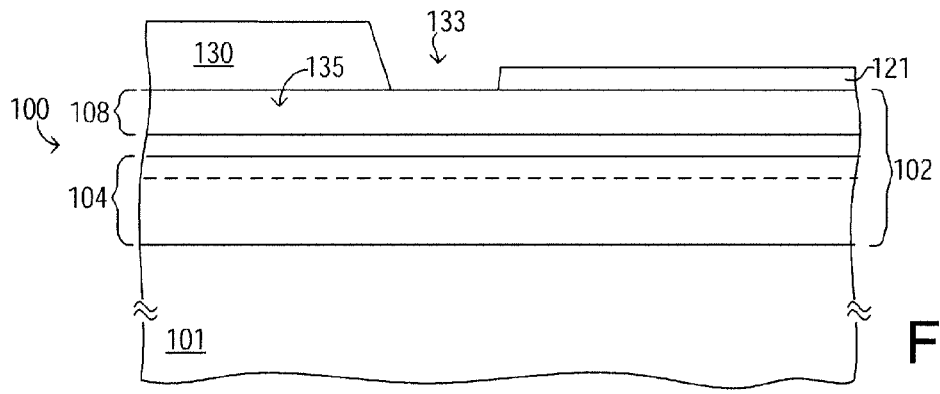
FIG. 6 depicts processing subsequent to FIG. 5 in which a contact structure is formed overlying a portion of the layered structure.

Referring now to FIG. 6, a contact structure 130 has been formed on an upper surface of layered structure 102 of wafer 100. The location of contact structure 130 defines the location of an underlying source/drain region 135. Unlike source/drain regions in conventional silicon MOSFET devices, the source/drain region 135 is not characterizable as an implanted region. In some embodiments referred to herein as implant free embodiments, the process does not include implantation of a dopant into source/drain regions 135.

In some embodiments, contact structure 130 is a metal structure characterized by a relatively high work function, e.g., a work function exceeding 5 eV. Contact structure 130 may be implemented with various metal materials including nickel, germanium, gold, or alloys thereof. Contact structure 130 may also include any other suitable metal elements, compounds, and/or alloys. Contact structure 130 may be formed with one or more thermal vapor deposition process(es) (e.g. electron-beam evaporation), one or more physical vapor deposition process(es) (e.g., sputter deposition), and/or one or more chemical vapor deposition process(es) using a conventional lift-off mask or etch mask processing sequence. In a lift-off mask sequence, the mask is deposited and patterned. The metal is then blanket deposited over the patterned mask. The unwanted portions of the metal, which overly photoresist, are removed by lifting off the photoresist using acetone.

The embodiment depicted in FIG. 6 emphasizes a gap feature wherein contact structure 130 is laterally displaced from gate dielectric 121 and, as a result, a gap 133 is defined between contact structure 130 and gate dielectric 121. An upper surface of layered structure 102 is exposed by the defined gap 133 whereas contact structure 130 overlies the portion of layered structure 102 on a first side of gap 133 and gate dielectric 121 overlies the portion of layered structure 102 on an opposing side or second side of gap 133. The size of gap 133 in some embodiments is in the range of approximately 20 to 70 nm.

In some embodiments, the presence of gap 133 is intentional and is designed into the applicable photomask by using different masks for gate dielectric etch and metal etch or lift-off and tailoring the metal etch or lift-off mask profile to ensure the formation of gap 133 following metal patterning. In contrast, at least some conventional III-V MOSFET processes use a single lift-off mask for etching oxide layer 120 and metal patterning. In these conventional processes, the sidewall and contact structure are self-aligned to each other and gap size, if any, is determined by mask profile and lateral undercut during dielectric etching or by taking into account resolutions of the contemplated lithography and patterning processes. In a worst case processing corner, processing may even result in overlap of the gate dielectric and the contact. The presence of gap 133 in the disclosed process beneficially prevents any overlap of contact structure 130 and gate dielectric 121. The relatively high work function associated with contact structure 130 would produce a highly undesirable depletion region underlying any overlap with gate dielectric 121.

Figure 7:
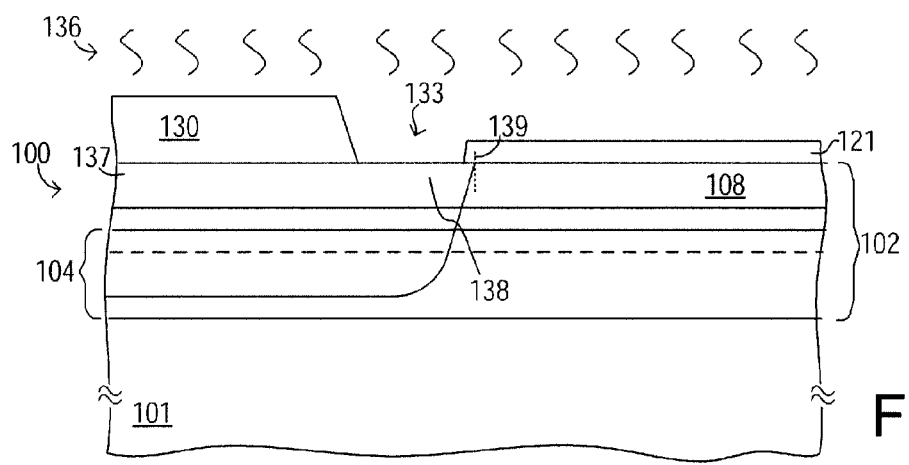
FIG. 7 depicts processing subsequent to FIG. 6 in which the contact structure is heated and an alloy region is formed at least partially within the underlying layered structure.

Turning now to FIG. 7, a thermal process 136 is performed to complete the formation of contact structure 130. In some embodiments, thermal process 136 may include a rapid thermal anneal during which wafer 100 is subjected to an ambient in a range of approximately 400° to 500° C. for a duration of approximately 20 to 60 seconds. The depicted thermal process 136 causes rapid diffusion or migration of metallic atoms in contact structure 130 that results in the formation of an alloy region 137 within layered structure 102 of wafer 100. Depending upon the specific implementation, alloy region 137 may have characteristics of a metal, semiconductor, or both.

A majority of alloy region 137 underlies contact structure 130. A portion of alloy region 137 extends laterally beyond boundaries defined by the overlying contact structure. As depicted in FIG. 7, for example, alloy region 137 includes a taper referred to herein as bridge portion 138 that extends beyond the portions of layered structure 102 that underlie contact structure 130. Alloy region bridge portion 138 as shown in FIG. 7 extends laterally to an end point 139. The position of end point 139 as shown in FIG. 7 is sufficiently displaced wherein bridge portion 138 spans all, more than, or a portion of layered structure 102 that underlies gap 133. In this sense, alloy region bridge portion 138 may be said to "bridge" gap 133. The presence of bridge portion 138 beneficially produces a desirably lower value of contact resistance $R_c$ for the resulting transistor device (200, shown in FIG. 10). In some embodiments, for example, the presence of alloy region bridge portion 138 in conjunction with the gap 133 results in an $R_c$ value which may be an order of magnitude lower than the 1.5-2.5 Ohm-mm $R_c$ values typical of prior art III-V MOSFETs.

Figure 8:
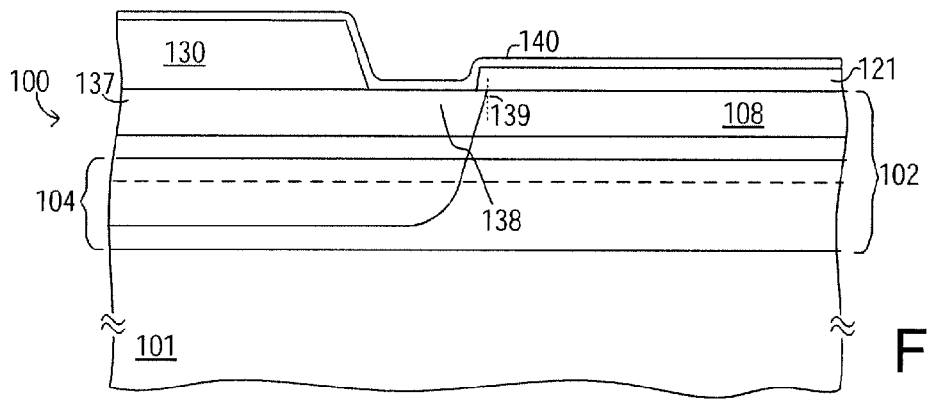
FIG. 8 depicts processing subsequent to FIG. 7 in which a first capping layer is formed.
Figure 9:
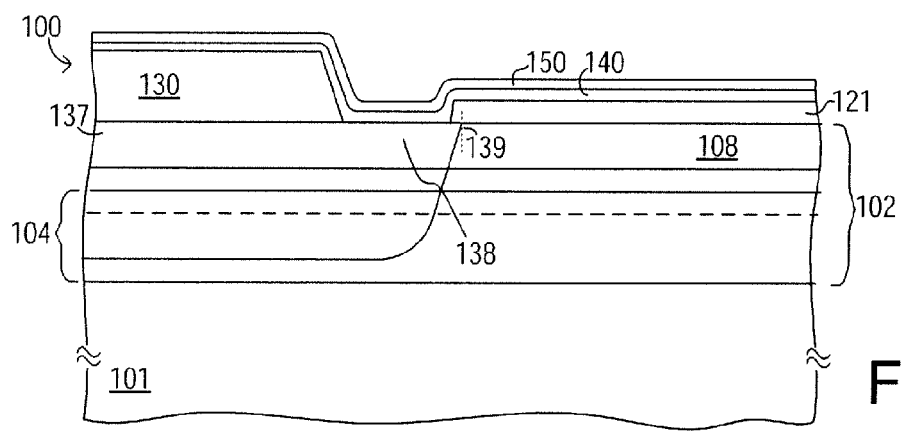
FIG. 9 depicts processing subsequent to FIG. 8 in which a second capping layer is formed overlying the first capping layer.

Turning now to FIG. 8 and FIG. 9, a two phase processing sequence is depicted to form an insulating film overlying gap 133 prior to the initiation of back end processing. In FIG. 8, a first capping layer 140 is formed overlying wafer 101. First capping layer 140, in some embodiments, is a silicon-nitrogen compound deposited at a relatively low deposition temperature. In one embodiment, for example, formation of first capping layer 140 includes depositing a silicon-nitrogen layer using a remote plasma process or an inductively coupled plasma process during which wafer 100 is maintained at or subjected to a room temperature ambient, e.g., an ambient of approximately 20-35° C. It is theorized that the low temperature formation of first capping layer 140 beneficially minimizes damage that occurs at the portion of structured layer 102 exposed by gap 133.

Following the formation of first capping layer 140, a second capping layer 150 is formed overlying first capping layer 140. In some embodiments, formation of second capping layer 150 is achieved by depositing a silicon-nitrogen compound using CVD at temperature of approximately 200° C. or less. Second capping layer 150 preferably produces a denser nitride film that is desirable to prevent unintended diffusion of species through first capping layer 140. In the absence of the denser second capping layer 150, "creases" in first capping layer 140 might provide paths for rapid diffusion of species that could result in undesired penetration of the capping layer.

Thus, the two-step capping layer process as described preferably includes a room temperature first deposition to minimize damage to the underlying substrate and a second, higher temperature, deposition to passivate the first capping layer and the underlying structures.

Figure 10:
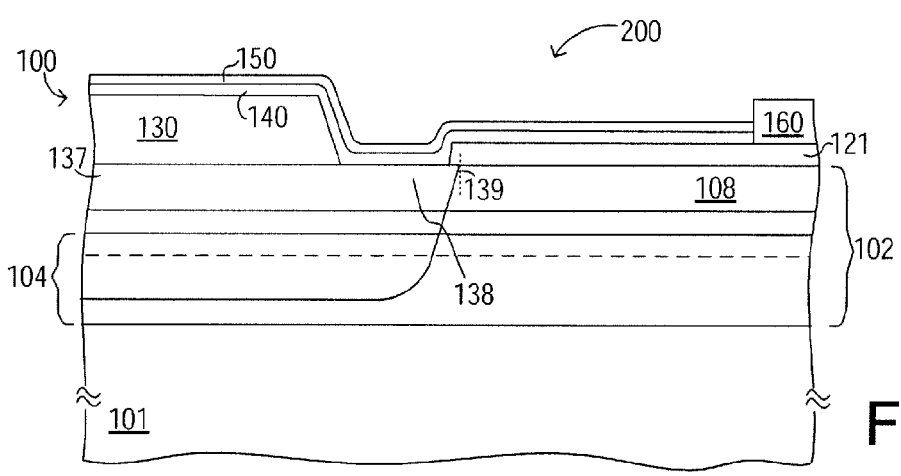
FIG. 10 depicts processing subsequent to FIG. 9 in which a gate electrode is formed overlying the gate dielectric.

Referring now to FIG. 10, a gate electrode 160 is formed overlying gate dielectric 121. Gate electrode 160 may be formed in some embodiments by depositing a metal layer overlying gate dielectric 121 and patterning the deposited layer using standard lithography and lift-off or etch processes, as is well known in the semiconductor industry. The material for gate electrode 160 is preferably a metal. The metal may be selected based on multiple factors including a work function of the metal and the dopant level of doped layers 105 and 109. Suitable metal materials include Pt and Ir.

Figure 11:
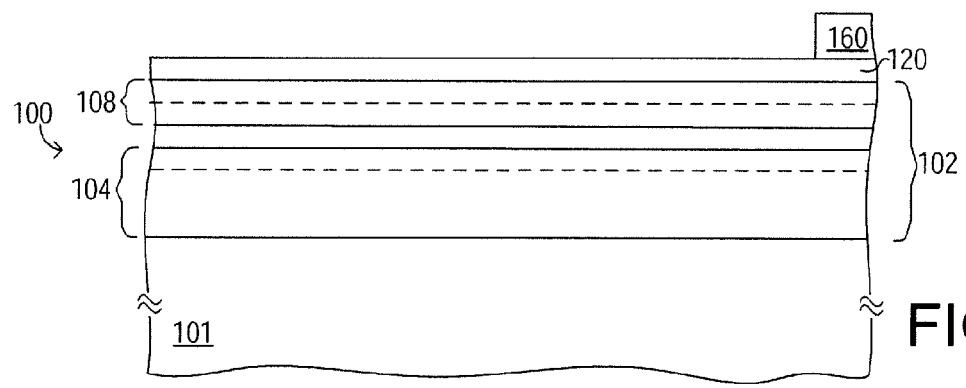
FIG. 11 depicts processing occurring subsequent to FIG. 3 and prior to FIG. 4 in an alternative embodiment of the processing sequence.
Figure 12:
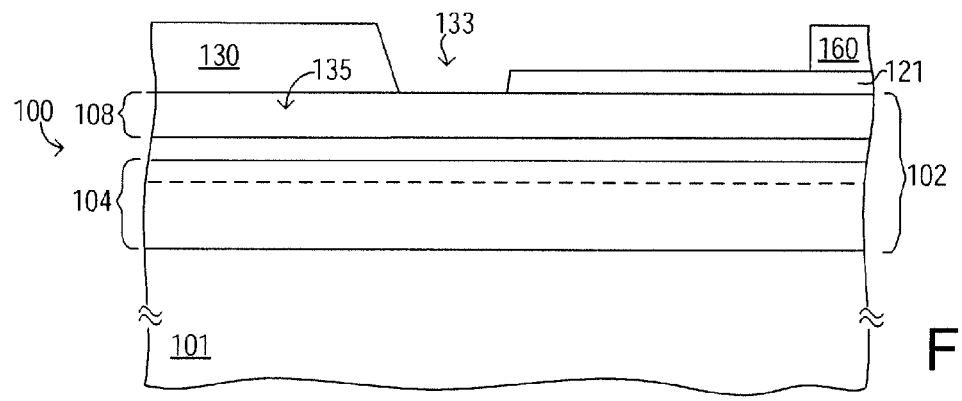
FIG. 12 depicts processing occurring in lieu of the processing depicted in FIG. 6 according to another alternative embodiment of the processing sequence.

Although the processing sequence depicted in FIG. 1 through FIG. 10 shows the gate electrode as being formed in FIG. 10 after formation of capping layers 140 and 150, the formation of gate electrode 160 may occur earlier in the processing sequence depending upon the implementation. In an embodiment illustrated in FIG. 11, for example, the gate electrode 160 is shown as being formed prior to etching gate dielectric layer 120. In this embodiment, FIG. 11 depicts processing that would occur prior to the patterning of gate dielectric layer 120 as represented in FIG. 4. In still another embodiment represented in FIG. 12, gate electrode 160 is formed simultaneously with the formation of contact structure 130. In this embodiment, the processing represented in FIG. 12 would replace the contact structure and gate electrode formation and processing represented in FIG. 6 and FIG. 10, respectively. This embodiment, however, would not offer the flexibility of using different materials and film thickness values for contact structure 130 and gate electrode 160.

Although the disclosed subject matter is described herein with reference to specific embodiments, various modifications and changes can be made without departing from the scope of the subject matter as set forth in the claims below. For example, although the detailed description describes specific compositions or compound for each of the layers other embodiments may use more or fewer layers including more or fewer layers in layered structure 102. Accordingly, the specification and figures are to be regarded in an illustrative rather than a restrictive sense, and all such modifications are intended to be included within the scope of that which is disclosed explicitly herein. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor fabrication process, comprising:
    forming, using molecular beam epitaxy, a gate dielectric layer overlying a wafer substrate, wherein the substrate includes at least one layer of a III-V semiconductor compound and wherein the gate dielectric layer includes a compound comprising an oxygen element and a second element wherein the second element is present in the III-V semiconductor compound;
    patterning the gate dielectric layer to produce a gate dielectric structure having a substantially vertical sidewall;
    forming a contact structure overlying said wafer substrate and laterally displaced from the gate dielectric structure, wherein the contact structure comprises at least one metal and wherein a lateral separation between the contact structure and the gate dielectric structure defines a gap;
    heat treating the contact structure to produce an alloy region within the semiconductor substrate, wherein the alloy region underlies the contact structure and extends across a portion of the wafer substrate underlying the gap; and
    forming a capping layer overlying the wafer.

2. The method of claim 1, wherein patterning the gate dielectric layer comprises:
    forming a polymethyl methylcrylate (PMMA) mask overlying a first portion of the gate dielectric and exposing a second portion of the gate dielectric layer; and
    removing the second portion of the gate dielectric layer by immersing the wafer in a highly dilute HCl solution.

3. The method of claim 1, wherein the substantially vertical sidewall forms an angle in the range of approximately 45° to 90° with the underlying substrate.

4. The method of claim 1, wherein contact structure has a work function exceeding approximately 5 eV.

5. The method of claim 1, wherein forming the contact structure includes forming at least one material selected from Ni, Ge, and Au.

6. The method of claim 1, wherein said heat treating comprises performing a rapid thermal anneal by subjecting the wafer to an ambient of approximately 440° C. for a duration of approximately 30 seconds.

7. The method of claim 1, wherein forming the capping layer comprises:
    forming a first capping layer of a silicon-nitrogen compound; and
    depositing a second capping layer of a silicon-nitrogen compound overlying the first capping layer.

8. The method of claim 7, wherein forming the first capping layer comprises forming the first capping layer using a room temperature deposition process.

9. The method of claim 7, wherein depositing the second capping layer comprises forming the second capping layer by chemical vapor deposition at a temperature of approximately 200° or less.

10. The method of claim 1, further comprising forming an epitaxial layered structure overlying the wafer substrate and wherein said forming of said gate dielectric comprises forming said gate dielectric overlying said epitaxial layered structure.

11. A method for fabricating a III-V MOSFET, comprising:
    forming a compound semiconductor layer overlying a wafer substrate;
    forming a gate dielectric layer overlying the compound semiconductor layer;
    patterning the gate dielectric layer to produce a gate dielectric structure;
    forming a contact structure comprising at least one metal element, the contact structure overlying the compound semiconductor layer and being laterally displaced from the gate dielectric structure sufficiently to define a gap between the contact structure and the gate dielectric structure;

forming an alloy region within the compound semiconductor layer by exposing the wafer to a heated ambient for a specified duration, wherein the alloy region includes at least some of the metal element and wherein the alloy region extends laterally through at least a portion of the compound semiconductor layer underlying the gap; and forming an insulating film overlying the wafer, wherein a lower surface of the insulating film is in contact with a portion of an upper surface of the compound semiconductor layer exposed by the gap;

wherein forming the insulating film comprises:
  depositing, at a temperature of less than approximately 30° C., a first capping layer film of a first silicon nitrogen compound; and
  depositing, using chemical vapor deposition at a temperature of less than approximately 200° C., a second capping layer film of a second silicon-nitrogen compound.

12. The method of claim 11, wherein patterning the gate dielectric layer comprises patterning the gate dielectric layer to produce a gate dielectric structure having a substantially vertical sidewall.

13. The method of claim 11, wherein patterning the gate dielectric layer comprises:
  depositing a film of polymethyl methylcrylate (PMMA) overlying the gate dielectric;
  exposing portions the PMMA film to radiation;
  removing exposed portions of the PMMA film to expose portions of the gate dielectric layer; and
  removing exposed portions of the gate dielectric layer by immersion in a highly dilute solution of HCl.

* * * * *